(12) United States Patent
Kurshan et al.

(10) Patent No.: US 7,937,673 B1
(45) Date of Patent: May 3, 2011

(54) METHOD AND SYSTEM FOR IMPLEMENTING TOP DOWN DESIGN AND VERIFICATION OF AN ELECTRICAL CIRCUIT DESIGN

(75) Inventors: Robert P. Kurshan, New York, NY (US); Kenneth L. McMillan, Berkeley, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 538 days.

(21) Appl. No.: 11/717,589

(22) Filed: Mar. 12, 2007

(51) Int. Cl.
*G06F 17/50* (2006.01)

(52) U.S. Cl. .............................. 716/1; 716/18
(58) Field of Classification Search ................ 716/1, 18
See application file for complete search history.

(56) References Cited

U.S. PATENT DOCUMENTS

| | | | | |
|---|---|---|---|---|
| 2004/0123254 | A1* | 6/2004 | Geist et al. | 716/4 |
| 2007/0156378 | A1* | 7/2007 | McNamara | 703/14 |
| 2007/0250799 | A1* | 10/2007 | Bunin et al. | 716/5 |
| 2009/0150136 | A1* | 6/2009 | Yang | 703/13 |

OTHER PUBLICATIONS

Namjoshi, K. S., et al., Syntactic Program Transformations for Automatic Abstraction, Lecture Notes in Computer Science, 2000, vol. 1855, pp. 435-449.
Hojati, R., et al., A unified Approach to Language Containment and Fair CTL Model Checking, DAC '93 Proceedings of the 30th international Design Automation Conference, 1993, pp. 475-481.
Xie, F., et al., Translating Software Designs for Model Checking, Lecture Notes in Computer Science, 2004, vol. 2984/2004, pp. 324-338.
Kurshan, R. P., Program Verification, Notices of the American Mathematical Society, 2000, vol. 47, Part 5, pp. 534-545.
Kurshan, R. P., Computer-Aided Verification of Coordinating Processes: The Automata-Theoretic Approach, Priceton University Press, Feb. 1995.

* cited by examiner

*Primary Examiner* — Jack Chiang
*Assistant Examiner* — Suchin Parihar
(74) *Attorney, Agent, or Firm* — Vista IP Law Group LLP (57) ABSTRACT

Disclosed is a method and system for performing design and verification using stepwise refinement techniques, which can also include or be referred to as "top-down" design verification. With the present stepwise refinement approach, the electronic design can be acted upon at different levels of abstraction, but with approximately the same level of resolution at each abstraction level. A strong relationship of consistency exists between the successive abstraction levels of the design. On account of this consistency, properties that are established or true at one level of the design remain true for all subsequent levels of abstraction of the design.

42 Claims, 9 Drawing Sheets

METHOD AND SYSTEM FOR IMPLEMENTING TOP DOWN DESIGN AND VERIFICATION OF AN ELECTRICAL CIRCUIT DESIGN

BACKGROUND AND SUMMARY

Many phases of modern electronic design are performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL.

An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may uses a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

Verification is performed at several stages to ensure that the electronic circuit design will work for its intended purpose. After an integrated circuit designer has created an initial integrated circuit design, the integrated circuit designer then tests and optimizes the integrated circuit layout using a set of EDA testing and analysis tools. At the logical level, simulation and formal verification are used to test the IC design. At the physical implementation level, common testing and optimization steps include extraction, verification, and compaction. The steps of extraction and verification are performed to ensure that the integrated circuit layout will perform as desired. The test of extraction is the process of analyzing the geometric layout and material composition of an integrated circuit layout in order to "extract" the electrical characteristics of the designed integrated circuit layout. The step of verification uses the extracted electrical characteristics to analyze the circuit design using circuit analysis tools.

As the quantity of data in modern IC designs become larger and larger over time, it has become apparent that conventional EDA tools are unable to effectively and efficiently scale upwards to handle very large electronic designs, such as many modern microprocessor, SOC, and systems designs. For example, the ability of conventional verification tools to handle simulation or formal verification is incompatible with many modern IC designs being produced by electronics companies that are constantly increasing in complexity and number of transistors. The basic problem is that conventional simulation and formal verification tools are designed to handle much smaller sets of data than exists for modern designs. This problem is exacerbated for all EDA tools by greatly increased functionality and feature sets for modern IC chips as well as constantly improving IC manufacturing technologies that can create IC chips at ever-smaller feature sizes, which allows increasingly greater quantities of transistors and other objects to be placed within the same chip area.

Organizations that design very large circuits may attempt to address these problems by using simulation or formal verification only at certain specified levels of the design, and not the entire design, so that the quantity of data sought to be verified is within the appropriate range for conventional EDA tools. The problem with this approach is that the entirety of the design may not be adequately verified and it is ineffective for identifying all problems with the design. Moreover, this approach may result in design flaws being found much later in the design cycle and even after market/production release of the product. As is well known in industry, the cost of fixing a design problem tends to significantly increase the further along the product is on the design cycle.

One approach to address these problems is to create specialized "ad hoc" models of the design at different levels, e.g., using C-based model to represent RTL. In this approach, the ad hoc designs would be tested and verified along with the RTL. There are many problems with this alternate approach. For example, the alternate approach fails to provide a consistent relationship across different abstraction levels. In other words, this approach has no relationship between the different levels other than at a conceptual level. There is a very large gap between what is determined at one level versus what actually happens at another level. Because of this, this approach requires the verification and correction process at the different levels to be repeated over and over again, often without any assurance that the design problems at a given level are truly being identified.

Transaction based verification is another approach for attempting to address the same problems. With transaction based verification, low level signal activities are grouped together into common "transactions". This is a notable attempt to act upon a circuit design at different levels of abstraction and is becoming more and more prevalent in the EDA product and technology space. The problem with conventional transaction based verification tools is that there is no guarantee of relationship between the different abstraction levels. In other words, there is no airtight guarantee that no errors identified at the transaction level will translate into no errors at the signal level, and vice versa. As a result, both existing transaction based verification tools and standards for electronic designs would need to be modified to comply with embodiments of the present invention.

The present invention addresses the above problems by providing an improved approach for designing and verifying electronic designs. In some embodiments, design and verification are performed using stepwise refinement techniques, which can also include or be referred to as "top-down" design verification. With the present stepwise refinement approach, the electronic design can be acted upon at different levels of abstraction, but with approximately the same level of resolution at each abstraction level. A strong relationship of consistency exists between the successive abstraction levels of the design. On account of this consistency, properties that are established or true at one level of the design remain true for all subsequent levels of abstraction of the design.

Further details of aspects, objects, and advantages of the invention are described below in the detailed description, drawings, and claims. Both the foregoing general description and the following detailed description are exemplary and explanatory, and are not intended to be limiting as to the scope of the invention.

DETAILED DESCRIPTION

The present invention provides improved approaches for designing and verifying electronic designs. In some embodiments, design and verification are performed using stepwise refinement techniques, which can also include or be referred to as "top-down" design verification.

With the present stepwise refinement approach, the electronic design can be acted upon at different levels of abstraction, but with approximately the same level of resolution at each abstraction level. What this means is that the amount of data to be accessed and operated upon at each level of abstraction for the purpose of verification is approximately the same, but the level of detail is different. For example, consider a verification process that first checks an IC design at a high level of abstraction, then at a medium level of abstraction containing more design details, and then at a even lower level of abstraction with many more details. Each level of verification will be performed at approximately the same level of complexity by focusing on more global properties at the higher levels of abstraction and only on more local properties that require more detail but less of the design at the lower levels of abstraction, thus including more and more local details of smaller and smaller components of the design as the process proceeds through lower and lower levels of abstraction of the design.

A strong relationship of consistency exists between the successive abstraction levels of the design. On account of this consistency, properties that are established or true at one level of the design remain true for all subsequent lower levels of abstraction of the design. It is this consistency of relationship between abstraction levels that allows proper scaling for verification tests throughout the entire design by allowing properties to be verified once and for all at the highest level of abstraction for which the property can be manifest in the available details of that level of abstraction, and then known to hold for all subsequently lower levels of abstraction without any need to re-verify them at these lower levels of abstraction. This allows verification made separately at the different levels of the design to be incorporated into an overall assessment of the entirety of the electronic design, including both higher levels as well as lower levels of the design.

Each level of abstraction contains a sufficient threshold of resolution such that the given abstraction level may be operated upon by an appropriate EDA tool. By this, it is meant that the amount of information pertaining to the design at a given abstraction level is sufficiently limited such that it can be adequately addressed by intended EDA tools. An EDA tool can therefore access the design at any one of a number of abstraction/magnification levels. If it is desired to operate upon the highest design level, then the EDA tool would simply access and operate at that level. If it is desired to operate upon more detailed levels of the design, then the EDA tool would simply access the design at lower levels of the design.

This scaling is accomplished by establishing a hierarchy of the properties to be verified, wherein the more global properties that require larger portions of the design to verify are verified at higher levels of abstraction, whereas the properties that require more details of the design to verify are verified at lower levels of abstraction. The design is arranged in such a manner that for these latter properties that require more details of the design in order to verify them, smaller more local portions of the design are sufficient in order to accomplish this verification. Thus, the hierarchy of properties is accompanied by a design discipline that enforces such locality of lower-level properties. Although designs that fail to follow this discipline may not submit to such scalable verification, such designs would also be harder to design correctly because the design would entail more and more low-level details that were essential to the verification of critical properties and this in turn would yield a growth in behaviors that needs to be checked relative to these properties. The number of such behaviors tends to grow exponentially in the number of design details, and thus verification for this quickly becomes intractable. Thus, the stepwise refinement approach embodies a design discipline that renders verification complete and tractable.

In some cases a property will require for its verification different levels of abstraction of respectively different parts of the design. For example, the verification of a particular property may require one or more design blocks to be represented at a low level of abstraction, containing relatively more details of the design, together with other blocks for which a greater level of abstraction is sufficient. Such imbalanced representations of the design are consistent with and may be a part of the stepwise refinement approach.

Since each property is limited in the amount of information that is required for its verification, EDA tools can adequately address intended functionality against that level of abstraction of the design without encountering overly large amounts of information that cannot be handled by the tool. Each property of the design to be verified can be progressively addressed in this manner through the stepwise refinement process until the entire set of design properties has been addressed by appropriate EDA design and verification tools.

In this manner, the complexity of each property verification remains under the threshold of what is possible with the available tools. Whereas the prior art strives to verify properties in this manner and may or may not succeed in each particular case, the stepwise refinement process disclosed herein increases the likelihood that property verifications will remain tractable by coordinating the design process with the abstraction process used for verification.

Figure 1:
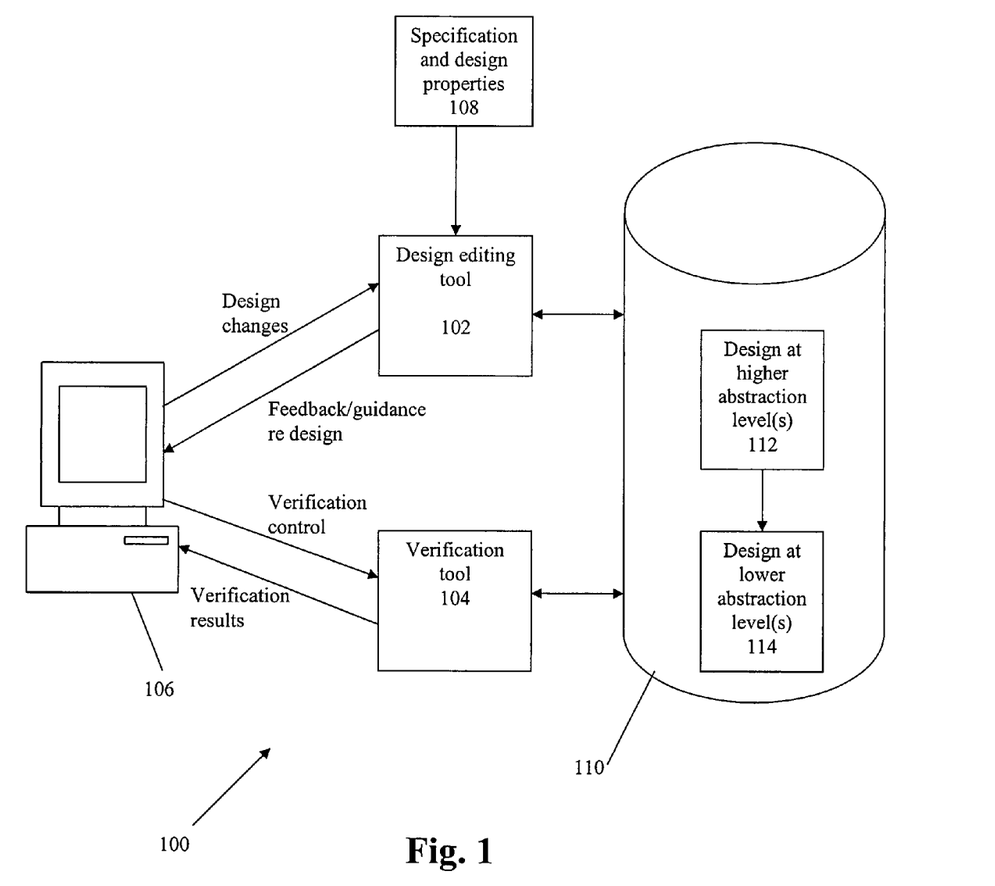
FIG. 1 shows a system for performing stepwise refinement of an electronic design according to an embodiment of the invention.

FIG. 1 shows an example system 100 for implementing this type of stepwise refinement design and verification approach. A design editing tool 102 is used by one or more users at user station 106 to design, editing, and/or revision of an electronic design. One or more verification tools 104 are employed to perform verification functions upon electronic design created and edited by the design editing tool 102. The electronic designs may be stored in a data storage device 110. The data storage device 110 may be used to store the electronic design at different levels of abstraction, e.g., a design 112 at a high level of abstraction and a design 114 at a lower level of abstraction. Both the design editing tool 102 and the users have access to one or more design specifications 108 to guide the formation of the electronic design.

The design editing tool 102 provides a framework for the designer to create and edit the electronic design at different levels of detail. At the different abstraction levels, it is contemplated that some portions of the electronic design will have much more detail than other portions of the electronic design. The different levels of detail that is used for a portion of the design is based upon whether the design portion is considered to be "more abstract" or "less abstract". High levels of detail are expected to be provided at higher abstraction levels for portions which are considered more abstract. However, less details are expected at higher abstraction levels for less abstract portions.

Many suitable approaches can be taken to partition a set of design properties into incremental categories of "more abstract" or "less abstract" and to then associate with each respectively appropriate portions of the design abstraction hierarchy. For example, one example approach to define whether a particular portion is more or less abstract is to consider the relative global or local nature of the properties related to those design portions. If the property relates to global effects on a system level, then it is more likely to be considered a high abstraction property. On the other hand, if a property is more local in nature, then it is more likely to be considered a lower abstraction property. A property may be considered "local" for some portions of the design and "global" for others. In this case, the property would be verified with the concomitant portions of the design represented at lower and higher levels of abstraction, respectively. The design of the abstraction hierarchy used for stepwise refinement is accomplished by first considering the totality of properties required to be verified and then establishing a stepwise refinement hierarchy that is suitable for the verification of the totality of properties in the manner described. Thus, the design process begins with a specification of required properties. Next, a matching stepwise refinement hierarchy is defined. Then the design is specified through the successive levels of abstraction of the hierarchy and together with this the respective properties are verified as soon as their associated levels of abstraction required by their verification have been defined.

This stepwise refinement process is aided through an editing mechanism that allows the designer to add levels of design detail as required by the stepwise refinement process and at the same time ensures that the added details are consistent with the previous levels of abstraction in the sense that the abstraction is "conservative", meaning that any properties verified at higher levels of abstraction remain true at all subsequent levels of abstraction. Whereas the alternative approaches start with a detailed level of a design and then seeks to find an appropriate conservative abstraction though which a particular property may be verified, the stepwise refinement process begins with an abstraction that is both suitable for verifying a respective property and is also capable of being refined into fully detailed design with respect to which the beginning abstraction is conservative. This is accomplished through a technique wherein at the higher levels of abstraction, lower level details are represented abstraction through specially designed placeholders or "stubs" whose high-level behavior is nondeterministic and thus captures all possible lower levels of behavior manifest once the stubs are replaced by actual design detail. The editing mechanism enforces the non-determinism of the stubs and the consistency of this non-determinism with the design details with which the stubs are eventually replaced, thus guaranteeing the conservative nature of the stepwise refinement hierarchy.

One can compare the coding of a design as is done conventionally, with the coding of that same design under this stepwise refinement process. In the conventional design coding, the design is coded block by block, each successive block at the same low level of detail, generally represented in register transfer level language. In the stepwise refinement process, the design is coded in order of the global extent of its functions. First more global functions are coded, leaving stubs for local details. Then the stubs are replaced with their design details, implementing more local functions of the design. Since both global and local functions touch many or all design blocks, each such design block is coded in stages. First, the global functionalities of all the design blocks are coded; then the more local functionalities of all the design blocks are coded. As a result, the coding of a particular design block is addressed in stages that follow the stepwise refinement hierarchy. Except for the small amount of code that is used to represent the stubs at higher levels of abstraction that are eventually replaced by detailed code at lower levels of abstraction, the actual amount of code written in the conventional process is essentially the same as the amount of code required by the stepwise refinement process, the difference being the order in which pieces of code are written. In conventional design, each block is coded from its beginning to its end. With the stepwise refinement process, a block of code may be partially coded and partially stubbed, then revisited later to replace the stubs with low-level detail.

The stepwise refinement process admits any number of levels of refinement. For example, a stub may be replaced with some low-level detail and one or more additional stubs. Moreover, a stub itself may contain some functional details. For example, a stub for an address block may start as a field that is non-deterministically either empty or nonempty. It then may be refined to a more detailed stub that abstracts the address as a single integer assigned by some deterministic process. Ultimately, this refined stub may be refined again to contain its ultimate level of detail, representing the address as a number of subfields with various meanings. Each intermediate representation (in this example, the integer) is a stub for a subsequent more detailed representation, until the last stub is finally replaced with the full level of detail of the design implementation.

The editing mechanism that mediates the refinement process would ensure that non-determinism of the first stub subsumed all subsequent behaviors of the successive refinements and that the abstraction of the address as a single value is consistent with the ultimate refinement of the address into its respective subfields. The editor would accomplish this by assuring that all possible values at lower levels of abstraction map in a consistent manner to the associated values at the prior higher levels of abstraction. This assurance could, for example, be accomplished by the editor automatically establishing a homomorphism between successive levels of abstraction.

Note that whereas in the example given, a stub was refined through a three-step refinement hierarchy, in general the number of steps engendered by the stepwise refinement process is arbitrary. Thus, when a design is coded using this stepwise refinement process, the coding of any individual block may occur though a arbitrary number of stages in which stubs in that block are replaced by more design details and possibly additional stubs in a successive manner.

The design editing tool 102 provides an interface and editing mechanism for the designer to create the design in a staged approach, where portions of the electronic design corresponding to a higher level of abstraction are created first. These design details form the basis of the higher abstraction design. When the higher abstraction level design is complete, it includes comprehensive design details for design portions relating to the higher abstraction properties. However, to the extent the designs at higher abstraction levels need to reference portions that are considered to be at lower abstraction levels, only stubs are placed into the designs to address these lower abstraction portions. The detailed design for these lower abstraction portions are left for later development.

Figure 2:
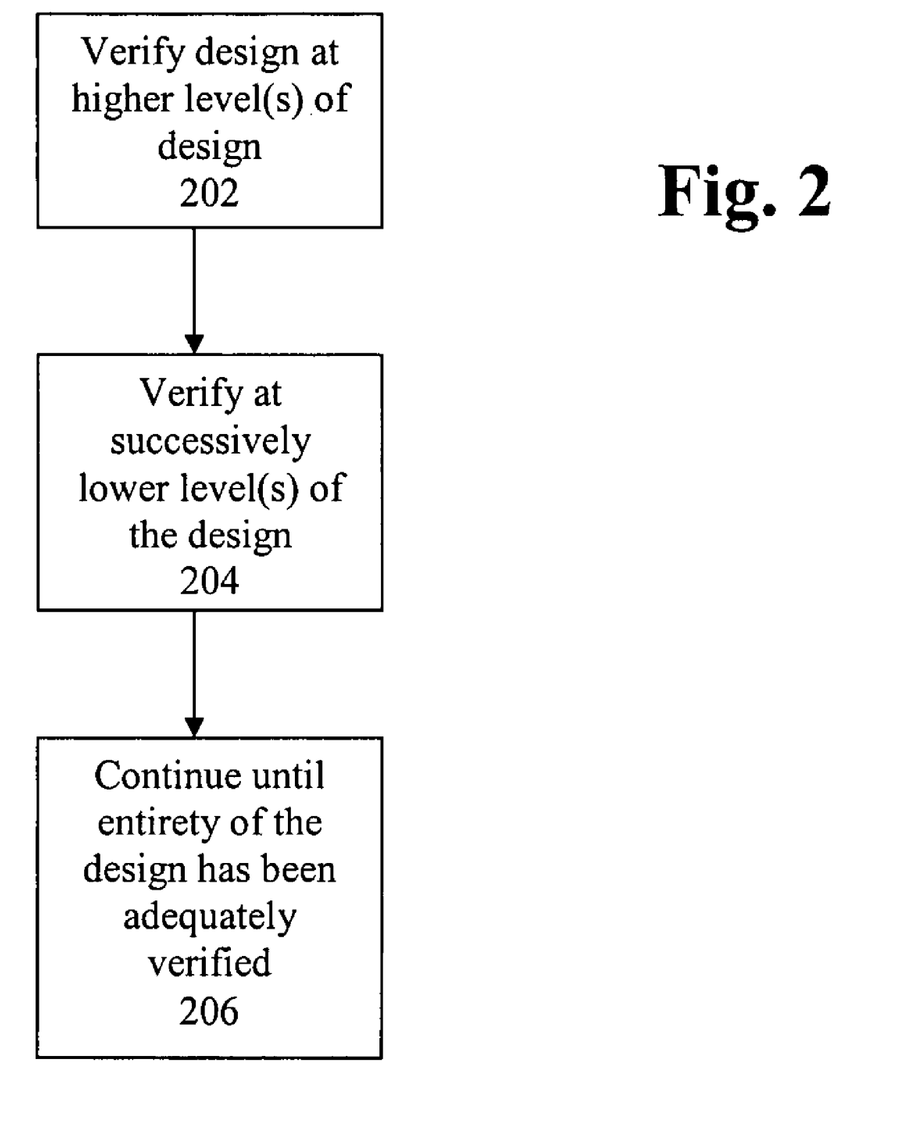
FIG. 2 shows a flowchart of process for verifying an electronic design according to an embodiment of the invention.

Once the higher abstraction design is complete, verification tools 104 can then be used verify the design for its properties relevant at that abstraction level. Any suitable verification tool can be employed to perform the verification functions. For example, simulation and/or formal verification can be used to verify the electronic design. Referring to FIG. 2, if the electronic design has already been implemented consistent with the invention, then verification can be performed separately using each appropriate level of abstraction. For example, verification can be made at the highest levels of abstraction for the design (202). Once the design has been adequately verified at that high levels, successively lower levels of abstraction for the design can be verified (204). The process continues until the entire design has been adequately verified (206). Either or both simulation and formal verification may be used for this verification process.

This verification action for higher abstraction designs highlights a significant advantage of the invention, in which problems associated the design can be caught at a much earlier stage of the design process. Instead of waiting until the entire design has been completed, this verification action may be used to identify and correct problems much earlier.

In addition, the verification used with the present invention can be performed in a far more focused way than exists conventional verification approaches. For example, for verification of design at higher abstraction levels using the invention, the verification inherently identifies any higher-level system-related problems with the electronic design. This means that the identified design problems are readily visible as system-related issues, and can be addressed on that basis. The designer does not need to be distracted by localized properties which may obscure or camouflage the system-related problems. Similarly, verification at lower abstraction levels inherently focuses the verification results to the more localized properties, since the more system-related properties have already been verified at higher abstraction levels.

Once the higher abstraction designs have been adequately verified, the designer at user station 106 uses the design editing tool 102 to create designs at successively lower abstraction levels. Recall that the higher abstraction designs include placeholders—stubs—for portions of the design which correspond to lower abstraction levels. Designs at lower abstraction are created by simply filling in the details of any appropriate stubs for those lower abstraction designs. The existing design details for the higher abstraction portions do not need to change since they had already been created with anticipated contemplation for the detailed design of the lower level details.

Figure 3:
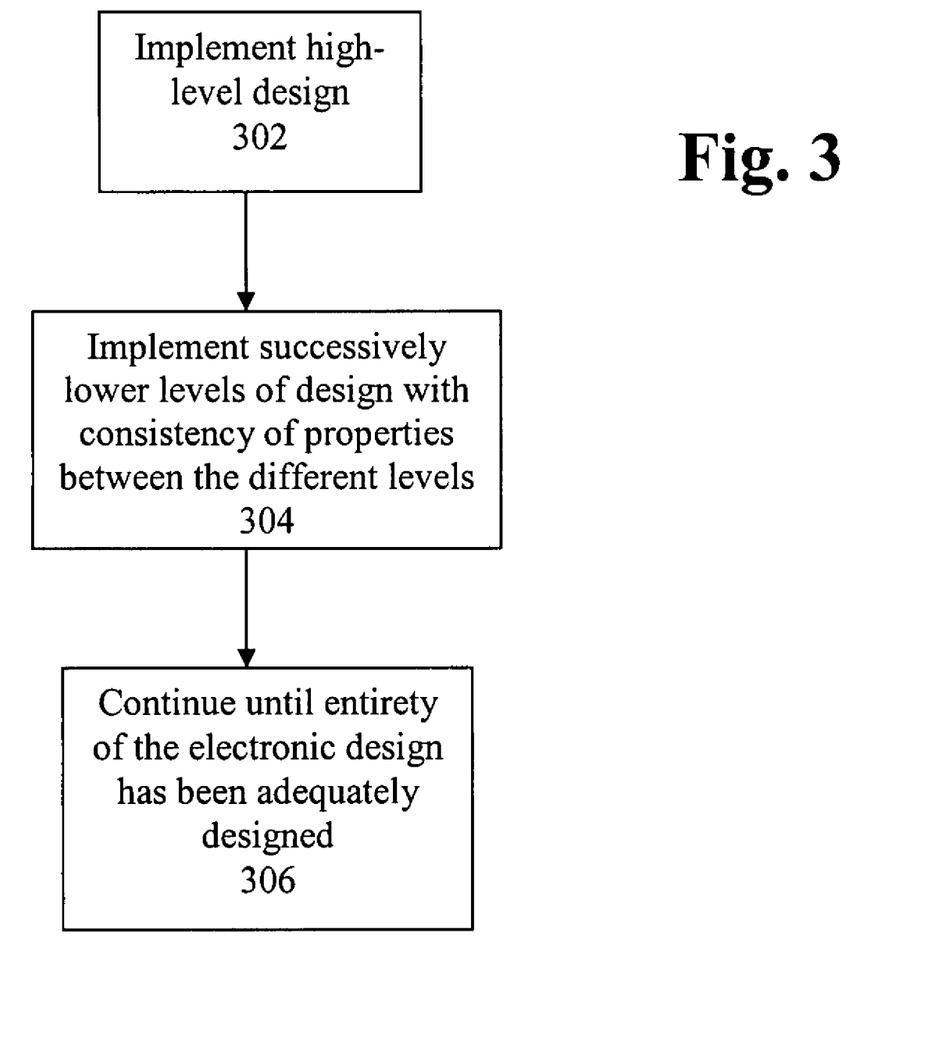
FIG. 3 shows a flowchart of process for implementing an electronic design according to an embodiment of the invention.

As each level of abstraction is addressed, the design editor tool 102 is used to create an design version for that abstraction level. More and more details of the design, appropriate for the abstraction level of interest, are provided at abstraction level. The verification tool 104 can be used to verify that design version at each successive abstraction level. Each level of abstraction is addressed in this manner until at the lowest level of abstraction, the entire design has been completed in detail. FIG. 3 show a flow of a process for implementing stepwise refinements for the different abstraction levels. As previously noted, the design editing tool 102 can be used to assist the designer to create higher level abstraction for the electronic design (302). The designer will then implement designs at successively lower abstraction levels in which properties that are established or true for one level of the design will remain true for other levels of the design (304). When a designer creates a version of the electronic design at a higher level of abstraction, that version of the design must satisfy certain properties for the design to be correct. As that design is refined to include more and more details for designs at lower levels of abstraction, those properties should be consistently satisfied for each design at each level of abstraction, regardless of the amount of additional design details that are added at each succeeding lower level of abstraction. This process continues, while maintaining consistency of properties across abstraction levels, until the entire electronic design has been completed (306).

The idea is to model successive levels of the design as formal refinements of the respective higher levels. This ensures that all verification at the higher levels carries to all lower levels. In particular, if a higher level is known to be correct with respect to certain property specifications, then the lower levels do not need to be re-verified for those property specifications—they are assured to hold in the lower levels with the same or better confidence that they are deemed to hold at the higher levels. Each level of the design can be verified, e.g., through application of formal verification or as a result of simulation test with sufficiently high coverage.

The design editing tool 102 is configured to enforce this consistency of properties across different abstraction levels and the different refinements applied to the design. In one embodiment, the design editing tool 102 checks the design entered by the designer to ensure that, by construction, the design details for one level of abstraction will be consistent with design details at other levels of abstraction. This can be accomplished by making sure the stubs are associated with the expected entry and return behavior as contemplated for the design. The control that enters the stubs should be represented. Importantly, the stubs should be non-deterministic in nature. As such, the surrounding design portions at the higher abstraction levels should be designed to anticipate and capable of addressing any of the possible outputs from stubs. When the details of the stubs are later provided as a refinement, then there should be complete compatibility and conservative consistency of verification results between the multiple levels of abstraction.

This highlights another significant contribution of the invention directed to the way in which refinements are defined. If the designer is given no guidance in defining a refinement, then it is very difficult to massage a lower level design to render it a formal refinement of a higher level design abstraction model. Moreover, starting with a low level design, e.g., at the RTL level, and then attempting to abstract it to a succession of higher levels can be very difficult if the low level design was not rendered in a way to make it amenable to abstraction. In fact, many or all successful formal verifications of complex designs through abstraction have been accomplished through modifications of the low level design (or through disregarding the low level design, instead utilizing a higher level "algorithmic" description). However, while such exercises are of considerable significance and value, they cannot ultimately assure the correctness of the low level implementation, from which they deviate. In the present invention, the low level implementation is guaranteed by construction to be a valid formal refinement of the higher level models.

One problem that may confront the designer in the practice of stepwise refinement is that even if the successive levels are formally consistent, the designer is required to write more code than would be required to write the bottom level (RTL) implementation alone. Thus, if the design is to be developed through N successive refinements, the designer perceives a requirement to write N designs where in conventional design, just one RTL design suffices. On account of this, notwithstanding the potential benefit of stepwise refinement regarding improved test coverage, designers regard the cost of writing N designs as too high.

A significant advantage of the invention is that the designer does not need to completely rewrite the design between different design versions. The existing design details for the higher abstraction levels are re-used for each successively lower level of abstraction for the design. The only significant change between the different abstraction levels is that more details are provided for the properties at the lower abstraction levels. Therefore, the cost of stepwise refinement according to the invention is essentially the same as the cost of writing a single design. Intuitively, this is accomplished by stratifying the original design into N parts, where each part corresponds to an abstraction at the corresponding refinement level.

Figure 4:
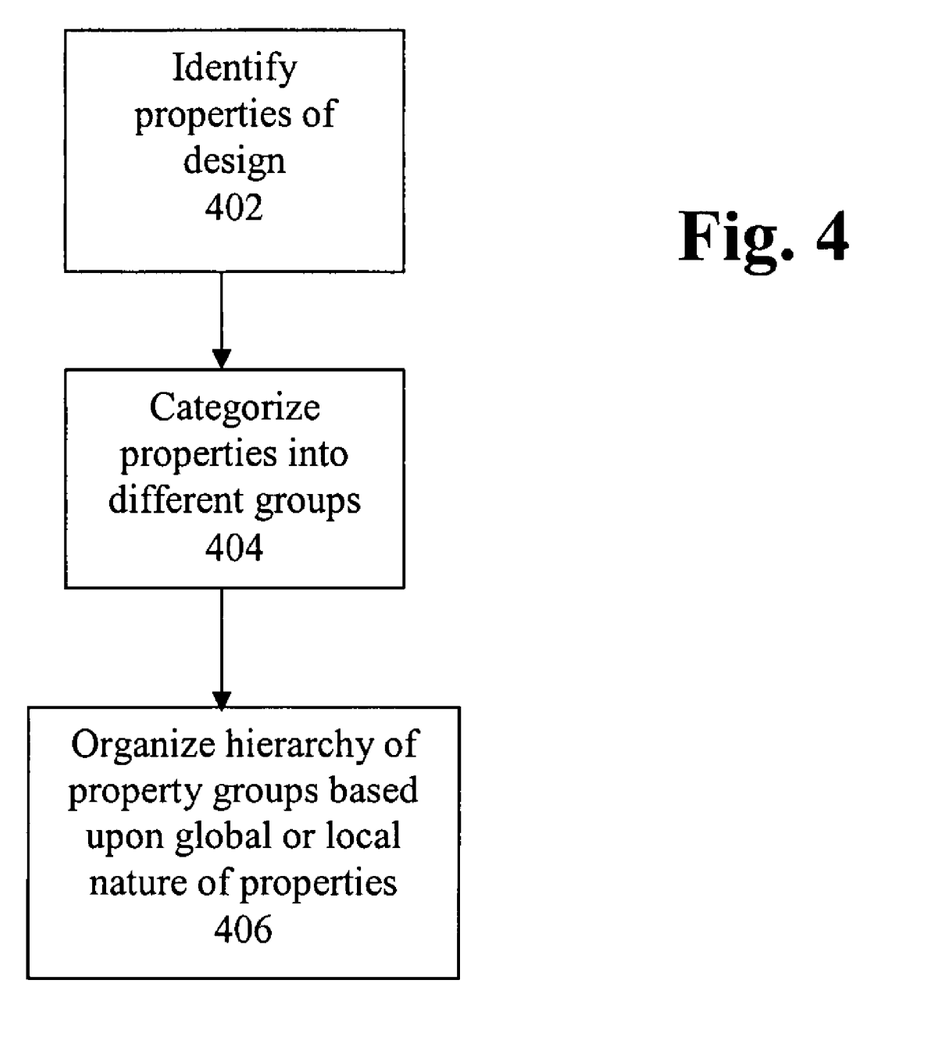
FIG. 4 shows a flowchart of process for organizing design portions in an electronic design according to an embodiment of the invention.

FIG. 4 shows a flowchart of an embodiment of a process for determining the portions of the overall electronic design that are associated with the different levels of abstraction. As previously noted, any suitable criteria can be taken to partition parts of the design and to identify those parts as being more abstract or less abstract. FIG. 4 is directed to an approach in which the properties of the design are considered to make this determination, and by considering the relative global or local nature of the properties. The process begins by first identifying the relevant properties of a design (402). This action can be accomplished either by identifying the properties during high-level design activities or by reviewing a high level design specification. Next, the individual design properties are placed into different groups based upon their relative global or local position relative to the overall design (404). Finally, each of those groups are organized relative to each other on the scale of being either more/less global or more/less local (406). The more global properties correspond to higher abstraction levels and the more local properties correspond to lower abstraction levels.

This process essentially partitions the functions of a design into levels that correspond to their appearance in the top-down design hierarchy. At the higher levels are functions with more global scope. Likewise, the appearance of data in the design hierarchy is matched to the functions that manage it. At higher levels, data is "stubbed" as a token with no value. At successive levels, data may be represented by 1 bit ("good" vs. "bad"), a message may be represented by its control field alone and values may be encoded as integers. At still lower levels, integers are re-encoded as bit fields and missing fields are added.

The process can be implemented by starting with a control flow graph corresponding to the design that is encoded as a state machine. Actions are represented as nondeterministic events with nondeterministic returns. In the course of the refinement process, the state machine is retained, but the tokens that represented the non-deterministic events are replaced by additional state machines that encode their actual behavior. These additional state machines may include additional tokens which represent non-deterministic events, which will eventually be refined into more detailed state machines at a subsequent level of abstraction. Continuing in this fashion through a succession of levels, each successive level adds to the previous level without appreciably deleting from the previous level. In this way, the entire design is developed, with each function encoded only once at its appropriate level of abstraction.

Figure 5A:
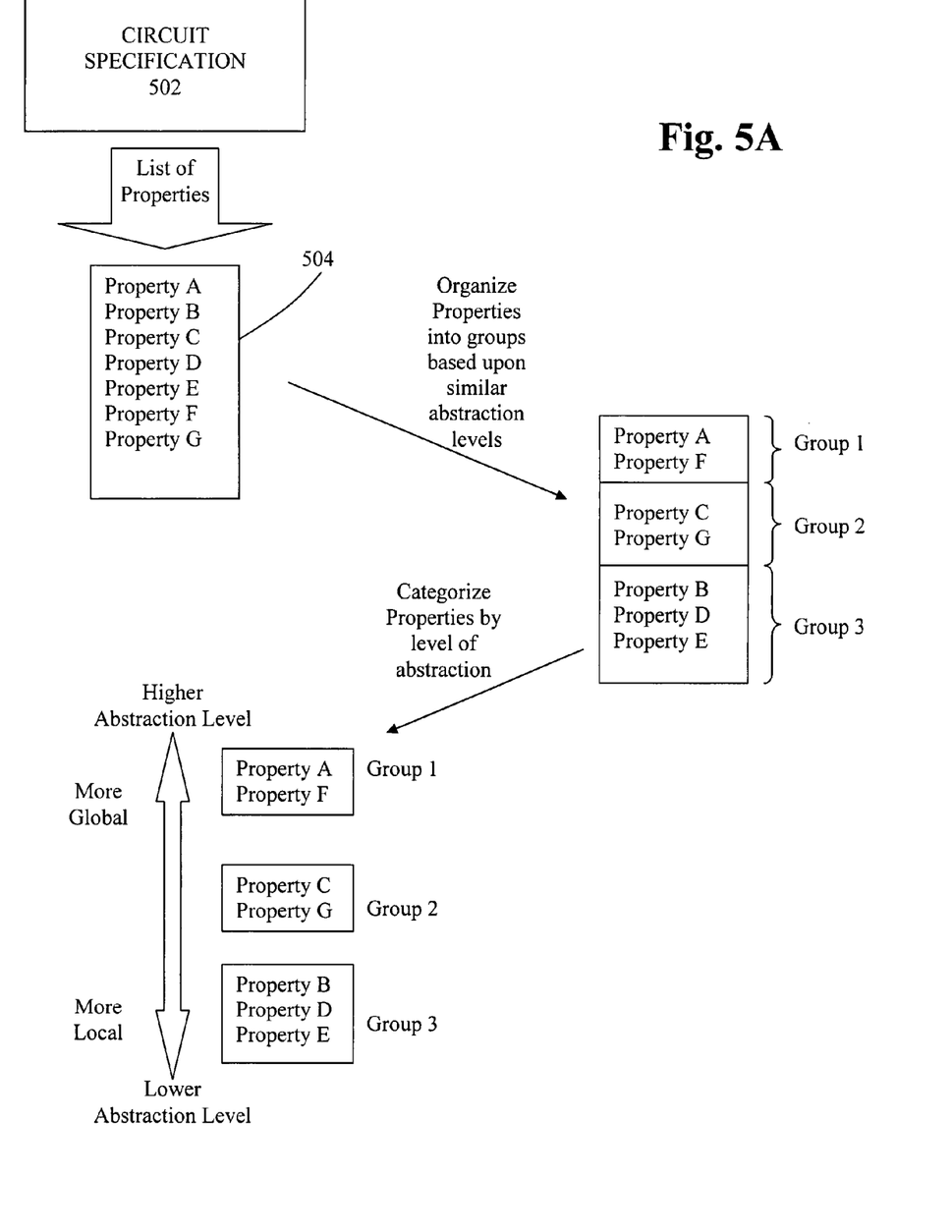
FIGS. 5A-D illustrates an approach for designing and verifying an example electronic design according to an embodiment of the invention.

To illustrate the invention, consider the specification 502 shown in FIG. 5A which corresponds to a set 504 of Properties A-G. The individual Properties A-G within set 504 are organized into groups based upon their relative global or local position relative to the overall design. Assume that Properties A and F are similarly situated as corresponding to high-level system properties. These two properties would be grouped together, e.g., as group 1. Further assume that Properties C and G correspond to intermediate properties that are both local and global in nature. These two properties would be grouped together, e.g., as group 2. Also assume that Properties B, D, and E all correspond to local properties. These three properties would be grouped together, e.g., as group 3.

Each of these groups of properties would be categorized as corresponding to different levels of abstraction. The properties in groups that are more global in nature would be categorized as corresponding to higher abstraction levels. The properties in groups that are more local nature are categorized as corresponding to lower abstraction levels. For the sake of illustration, groups 1-3 are categorized as shown in FIG. 5A in which Properties A and F in group 1 correspond to the highest abstraction level, Properties C and G in group 2 correspond to a medium abstraction level, and Properties B, D, and E in group 3 correspond to the lowest abstraction level.

Figure 5B:
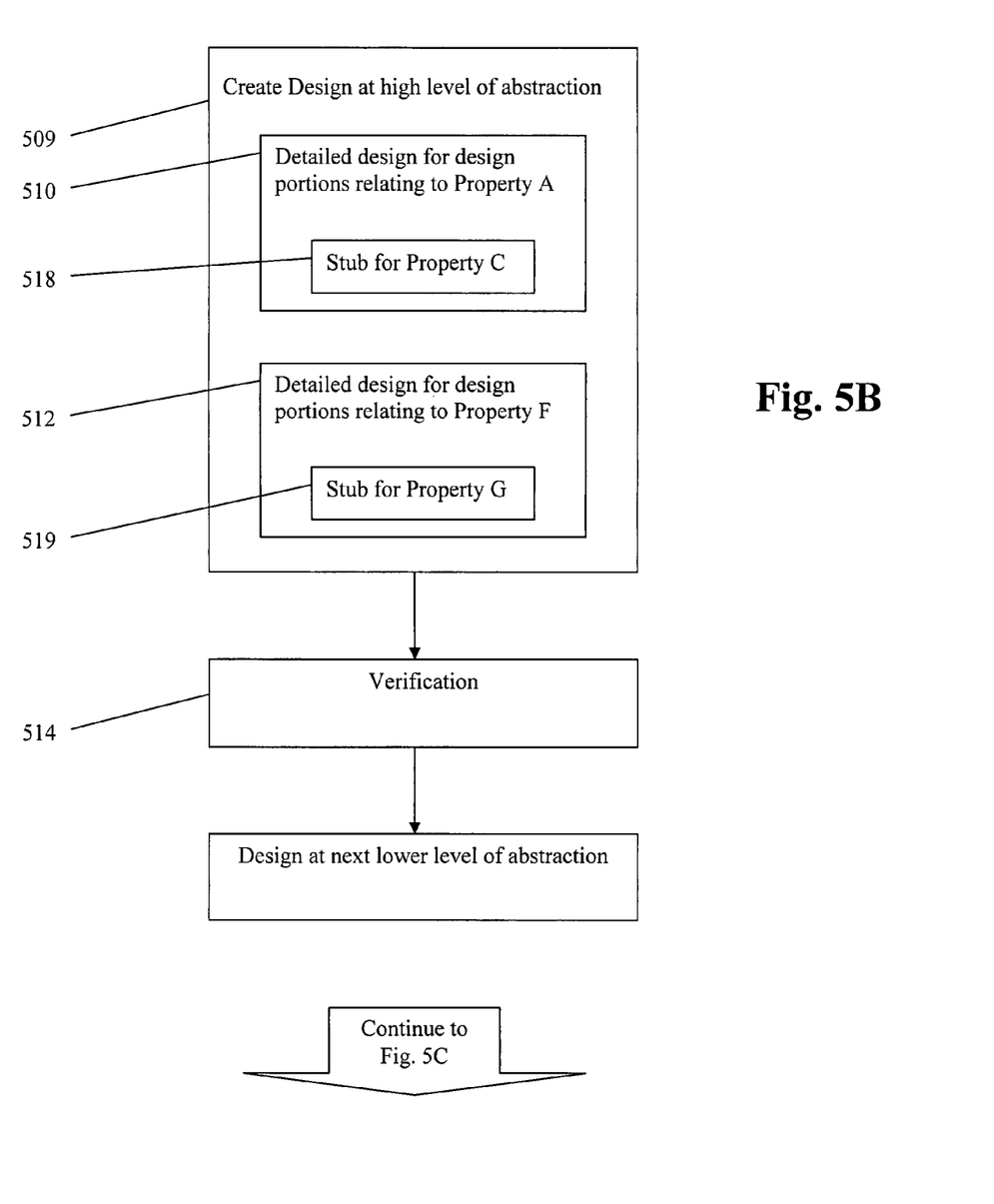

Referring to FIG. 5B, the process would continue by creating a design version 509 at a high level of abstraction. This level of the design 509 would include a high level of refinement of the design portions associated with the higher abstraction properties, but would have lower levels of refinement for design portions related to lower abstraction properties. Since Properties A and F in group 1 correspond to the highest abstraction, portions 510 and 512 of the electronic design associated with these properties would be designed in refined detail for the design version 509 at the highest abstraction level.

Placeholders (or "stubs"), which can be represented as un-interpreted functions, would be placed as appropriate into the design 509 to address design portions associated with lower abstraction levels. As shown in FIG. 5B, the design portions associated with Properties C and G in group 2 could be represented in design version 509 with stubs 518 and 519. These stubs 518 and 519 will be replaced with greater design details during subsequent refinement stages of the design.

Verification 514 can be performed upon design version 509 at the high level of abstraction. The design at the high level of abstraction can be edited to correct any problems identified by verification 514.

Figure 5C:
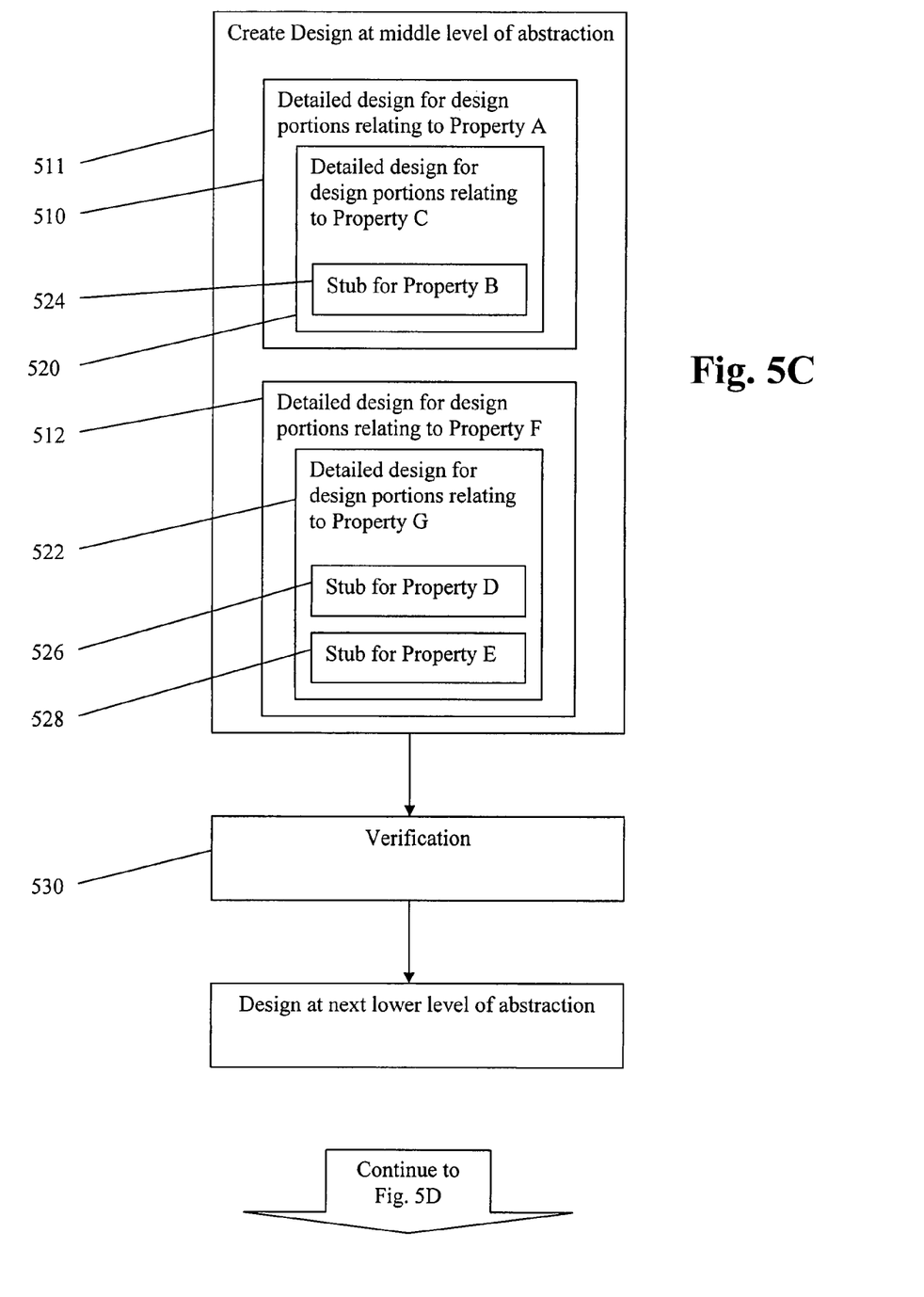

The process can then proceed to refine the design at the next level of abstraction. Referring to FIG. 5C, this level of the design 511 would include a high level of refinement of the design portions associated with the higher and medium abstraction properties, but would have lower level of refinement for design portions related to lower abstraction properties. Properties A and F in group 1 which correspond to the highest abstraction have already been refined as design portions 510 and 512. At this point, design version 509 of FIG. 5B would be refined into design version 511 of FIG. 5C by replacing stubs 518 and 519 of design version 509 with design details 520 and 522 in design version 511. These detailed design portions 520 and 522 could include stubs 524, 526, and 528 to address Properties B, D, and E which correspond to a lower abstraction level. These stubs 524, 526, and 528 will be replaced with greater design details during subsequent refinement stages of the design.

Verification 530 can be performed upon design version 511 at the medium level of abstraction. The design at the medium level of abstraction can be edited to correct any problems identified by verification 514.

Figure 5D:
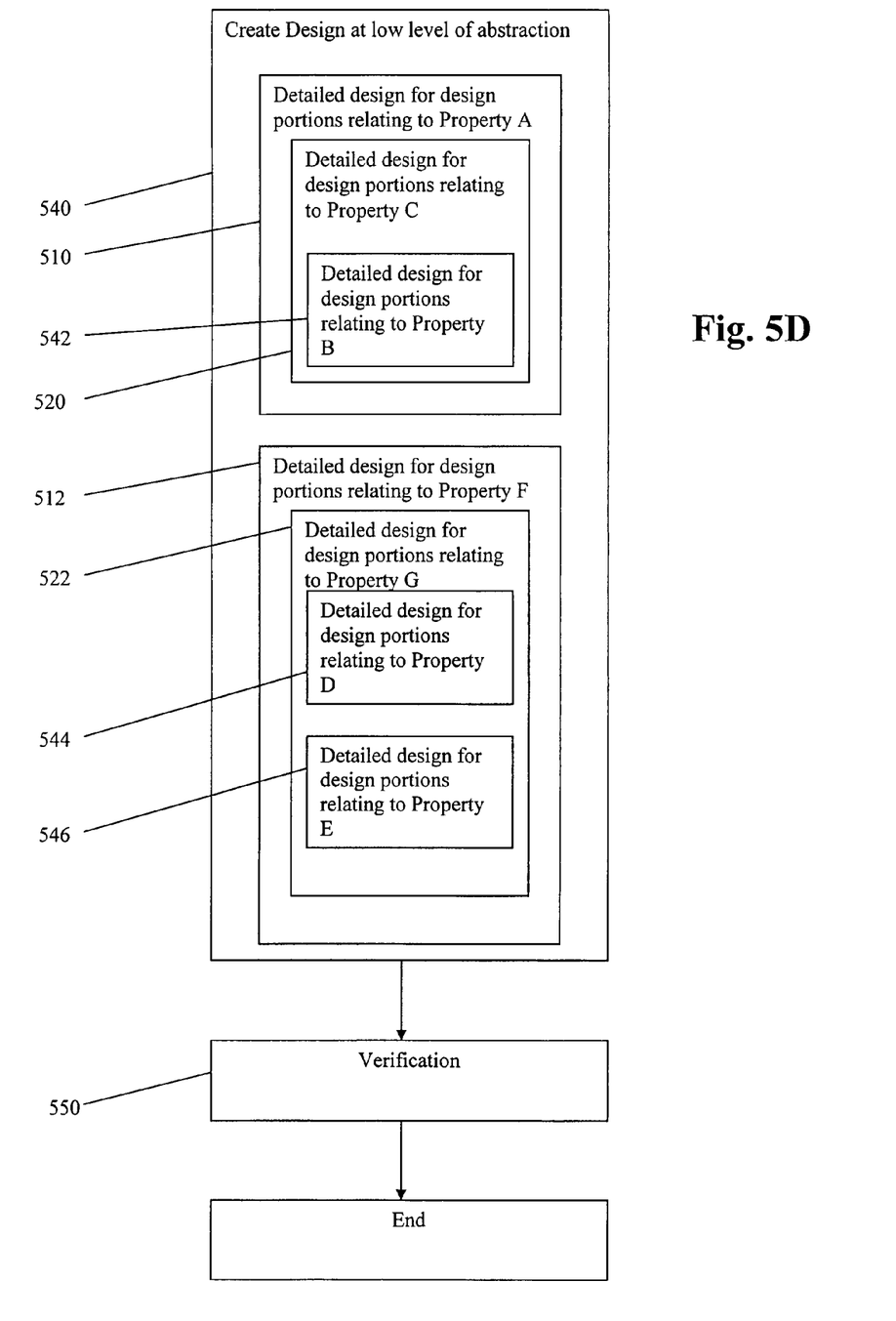

The process can then proceed to refine the design at the next lower level of abstraction. Referring to FIG. 5D, this level of the design 540 would include a high level of refinement of the design portions associated with the high, medium, and low levels of abstraction properties. Properties A and F in group 1 which correspond to the highest abstraction level have already been refined as design portions 510 and 512. Properties C and G in group 2 which correspond to the medium abstraction level have also been refined already as design portions 520 and 522. At this point, design version 511 of FIG. 5C is refined into design version 540 of FIG. 5D by replacing stubs 524, 526, and 528 of design version 511 with design details 542, 544, and 546 in design version 540.

Verification 550 can be performed upon design version 540 at the lowest level of abstraction. The design at the lowest level of abstraction can be edited to correct any problems identified by verification 550. At this point, refinement has been performed to even the most local portions of the design. Therefore, the entire electronic design is complete at this point.

This illustrates the advantage of the invention described above, in which the cost of stepwise refinement is essentially the same as the cost of writing a single design. The original design is essentially stratified into N parts, where each part corresponds to an abstraction at the corresponding refinement level.

For example, consider an electronic design that includes a CRC (cycle redundancy check, for error detection) operation. The CRC operation is not encoded at N successive levels of abstraction, which would be burdensome to the designer, but is introduced just once at an appropriate level of abstraction in the stepwise refinement hierarchy. At higher levels, the CRC is represented by a stub or in such a way that the model with the stub is a formal abstraction of the model with the CRC. Therefore, the model with the CRC is a formal refinement of the model with the stub, rendering the two models "consistent".

As noted above, the process can be implemented by starting with a control flow graph corresponding to the design that is encoded as a state machine where actions are represented as nondeterministic events with nondeterministic returns. In the course of the refinement process, the state machine is retained, but the tokens that represented the nondeterministic events are replaced by additional state machines that encode their actual behavior. Through a succession of levels, each successive level adds to the previous level without appreciably deleting from the previous level. For the present CRC example, the design and verification process can be implemented, for example, by encoding global control flows in detail at higher abstraction levels while representing the CRC operation as a stub and representing the packets only as abstract tokens. At the highest levels, specific data structures, e.g., for packets, may remain abstract since the higher level control flows do not necessarily need such low level details to be appropriately encoded. In a subsequent refinement stage, the high level control flows are retained, but the designer replaces the CRC stub by encoding the details of the CRC operation which includes any control flows needed to implement the CRC operation. Any data structures that are needed to implement the CRC operation at this level are also refined in detail, such as any necessary details of data structures for the data packets which are operated upon by the CRC operation. The representation of the packet may still be abstracted as a token in some ways, but will include sufficient data fields/structures as appropriate to address the control flows of the CRC operation. At each subsequent level, the designer will add more control and more data structure details. The level of detail to be encoded for control flows and data structures at each level is driven by the property being addressed at that level.

The stub modeling is implemented with non-determination to enable the above consistency considerations. In order to be consistent with its refinements, behavior in the actual CRC level model has a representation in the stub level model. Since the stub in fact makes no computations, it is given the ability to shadow the behaviors of the CRC. This is accomplished by endowing the stub with the entry and return behaviors of the actual CRC. The control that enters the CRC function has a representation in the stub. As well, the action corresponding to the return of the CRC has a representation in the stub, e.g., the CRC and stub both can return "pass" and "fail".

Since the stub embodies no concept of actual computation, it does not represent the actual time or number of clock cycles that occur in the actual CRC computation. To render the stub conservative, it is allowed to model computation for any non-deterministically determined period. Thus, the stub has an entry and non-deterministic return.

Likewise, since the stub makes no actual computation, there is no way to correctly return "pass" or "fail" relative to an actual message. Instead, the stub will non-deterministically return either (or both) "pass" or "fail" after a nondeterministic time interval. Since the stub is making no actual computation on a message, the message too will be abstracted at this level to a single token (without data content). Thus, at this level, the correctness of the CRC cannot be verified. What can be verified is the correct handling in the design of the two possible returns of the CRC, i.e., pass or fail. At this level of abstraction, it would be verified that if the CRC returns "pass" then the design performs the correct actions relative to a "pass", and likewise for "fail". Only at a subsequent level will the correct action of the CRC itself be checked. This will occur at a level of abstraction at which both the CRC and messages are accurately represented. Since the behavior of the stub is more general than that of the actual CRC, if a property is verified with respect to the stub, it is guaranteed to hold at the CRC level as well.

The theories of un-interpreted functions can be applied to stubs. Thus, for example, if an un-interpreted'function is modeled so as to return 0 (perhaps as a non-deterministic choice), then its addition to another value is that other value, although the stub did no actual computation. Such analysis can extract useful data form stubs.

At the CRC level, in this example, the behavior of the CRC algorithm will be verified. But its correct performance in the context of the larger design has already been verified at a higher level of abstraction and thus does not need to be re-verified. Thus, to verify the CRC (at the CRC level), the associated control code can be disregarded or abstracted. In this way, although the lower level is intrinsically more complex than the higher levels, the verification obligations are more localized. Therefore, the complexity of the verification can be maintained as a feasible computation. The higher levels focus on global behavior at a high level of abstraction, while the lower levels focus on local behaviors with their complex detail made explicit. If this balance is done properly, the computational burden of verification is held more or less constant from level to level and thus verification coverage should be as good for large designs as it is for small designs.

Embodiments of the invention can be implemented as a business method for distributing design IP (intellectual property). Off-the-shelf components and blocks can be created and distributed at different levels of abstraction. The off-the-shelf blocks should be designed with adequate consistency of properties across different abstraction levels. In one embodiment, specifications can be provided for the off-the-shelf blocks at different abstraction levels so that it can be used in the inventive process by third parties. In this manner, customers can identify and ensure that the commercially obtained design blocks from third parties will work adequately within an organization's overall design. The published specifications can therefore be used as a marketing tool for greater sales of commercial design blocks.

SYSTEM ARCHITECTURE OVERVIEW

Figure 6:
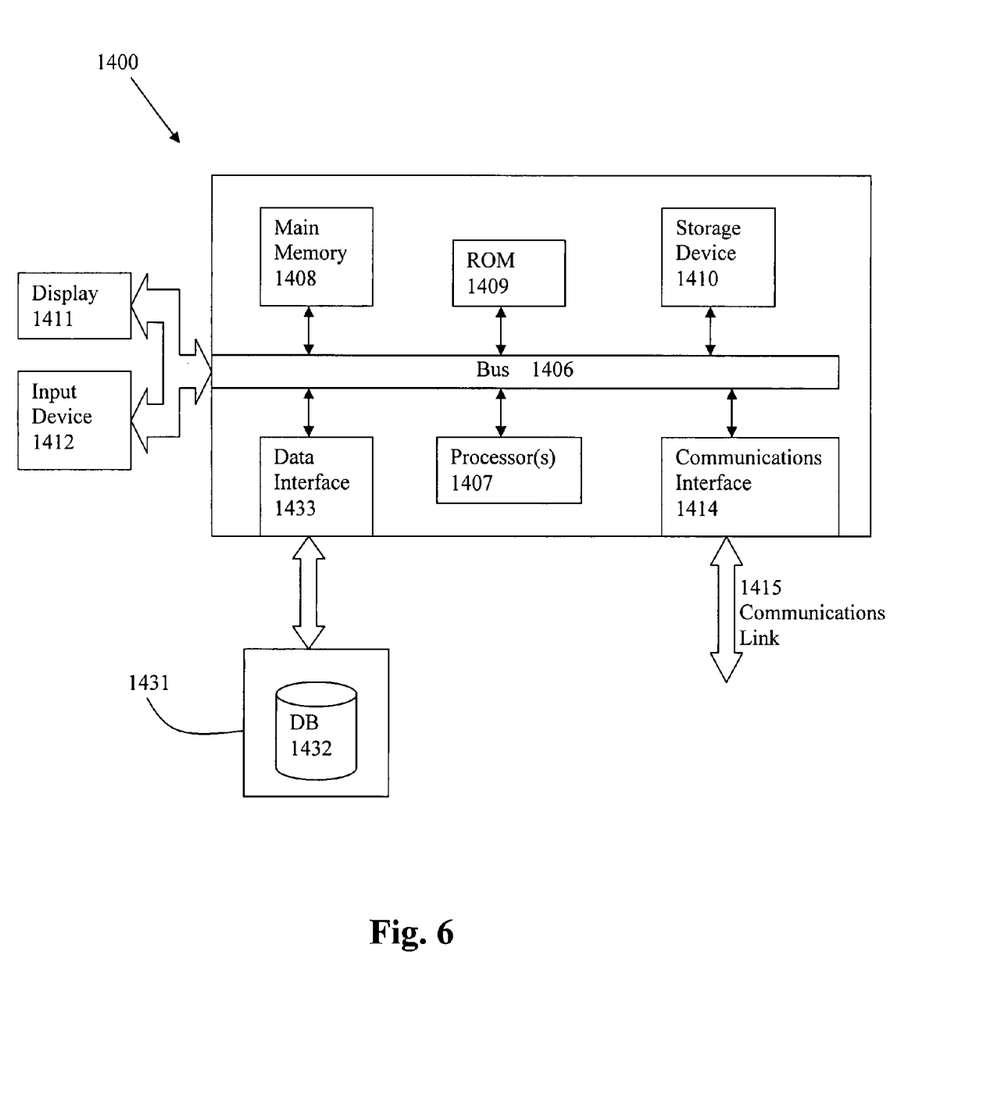
FIG. 6 shows an architecture of an example computing system with which the invention may be implemented.

FIG. 6 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for implementing an electronic design, comprising:
designing the electronic design at a higher level of abstraction;
refining at least a portion of the electronic design on at least one successively lower level of abstraction by considering at least a first resolution for the at least the portion or another portion of the electronic design at the higher level of abstraction in the act of refining the electronic design, wherein
the act of refining further comprises determining whether one or more stubs in a higher abstraction version in the at least the portion of the electronic design that comprises the one or more stubs are to be refined as corresponding detailed design encodings at a lower abstraction version of the electronic design based at least in part on maintaining the first resolution and a second resolution for the at least the portion of the electronic design at the at least one successively lower level of abstraction at approximately a same level; and
verifying one or more properties at some or all of different abstraction levels of the electronic design by using at least one processor, wherein
a property verified at first abstraction level of the design will remain true at a second abstraction level of the design.

2. The method of claim 1 in which the higher abstraction version comprises more design details the lower abstraction version of the electronic design.

3. The method of claim 1 in which the higher abstraction version focuses on a more global property and the lower abstraction version focuses on a more local property of the electronic design.

4. The method of claim 1 in which both the higher abstraction version and the lower abstraction version of the electronic design comprise sufficient resolution for verification by an EDA tool.

5. The method of claim 4 in which information for each of the higher abstraction version and the lower abstraction version is sufficiently limited to allow the EDA tool to verify the design at different magnification levels.

6. The method of claim 1 in which a given abstraction level of the electronic design may have different portions of the electronic design at different abstraction levels, with a first portion of the electronic design is at a higher abstraction level and a second portion of the electronic design at a lower abstraction level.

7. The method of claim 1 further comprising identification of properties for the electronic design and categorization of the properties into different groups.

8. The method of claim 7 in which the properties are required properties.

9. The method of claim 7 further comprising defining a refinement hierarchy.

10. The method of claim 9 in which the refinement hierarchy is organized based upon global or local natures of the properties.

11. The method of claim 7, further comprising using a control flow graph corresponding to the electronic design.

12. The method of claim 11 in which the control flow graph is encoded as a state machine.

13. The method of claim 12 in which one or more actions are represented by one or more tokens that correspond to non-deterministic events.

14. The method of claim 13 in which refinement is performed by replacing the one or more tokens with additional state machines that encode more detailed behavior.

15. The method of claim 1 in which the one or more stubs comprise behavior that is non-deterministic.

16. The method of claim 15 in which non-deterministic behavior is consistent with possible lower levels of behavior once the one or more stubs are replaced with greater design details.

17. The method of claim 1 in which refinement of the electronic design does not require completely rewriting the electronic design between the some or all of the different abstraction levels.

18. The method of claim 1 in which the electronic design comprises both hardware and software design components.

19. The method of claim 1 in which the electronic design comprises design IP comprising off-the-shelf components or blocks.

20. A system for implementing an electronic design, comprising:
a design editing tool for designing an electronic design, in which the design editing tool is adapted for refining at least a portion of the electronic design in at least one successively lower level of abstraction by considering at least a first resolution for the at least the portion or another portion of the electronic design at the higher level of abstraction in the act of refining the electronic design, wherein
the design editing tool is further configured for determining whether one or more stubs in a higher abstraction version in the at least the portion of the electronic design that comprises the one or more stubs are to be refined as corresponding detailed design encodings at a lower abstraction version of the electronic design based at least in part on maintaining the first resolution and a second resolution for the at least the portion of the electronic design at the at least one successively lower level of abstraction at approximately a same level;
a verification tool that comprises at least one processor which is programmed for verifying one or more properties at some or all of the different abstraction levels of the electronic design, wherein
a property verified at first abstraction level of the design will remain true at a second abstraction level of the design; and
a computer program product which comprises a computer readable storage medium or a computer storage device programmed for storing the electronic circuit design.

21. The system of claim 20 in which the higher abstraction version comprises more design details the lower abstraction version of the electronic design.

22. The system of claim 20 in which the verification tool comprises a simulation tool or a formal verification tool.

23. The system of claim 20 in which the higher abstraction version focuses on a more global property and the lower abstraction version focuses on a more local property of the electronic design.

24. The system of claim 20 in which a given abstraction level of the electronic design may have different portions of the electronic design at different abstraction levels, with a first portion of the electronic design is at a higher abstraction level and a second portion of the electronic design simultaneously at a lower abstraction level.

25. The system of claim 20 in which the editing tool implements the one or more stubs with behavior that is non-deterministic.

26. The system of claim 25 in which the non-deterministic behavior is consistent with all possible lower levels of behavior once the one or more stubs are replaced with greater design details.

27. The system of claim 20 in which the electronic design comprises both hardware and software design components.

28. The system of claim 20 in which the electronic design comprises design IP comprising off-the-shelf components or blocks.

29. The system of claim 20 in which the editing tool provides an interface to create the electronic design in a stepwise staged approach.

30. A computer program product comprising a non-transitory computer useable storage medium having a sequence of instructions which, when executed by at least one processor, causes the at least one processor to execute a process for implementing an electronic design, the process comprising:
designing the electronic design at a higher level of abstraction;
refining at least a portion of the electronic design on at least one successively lower level of abstraction by considering at least a first resolution for the at least the portion or another portion of the electronic design at the higher level of abstraction in the act of refining the electronic design, wherein
the process of refining further comprises determining whether one or more stubs in a higher abstraction version in the at least the portion of the electronic design that comprises one or more stubs are to be refined as corresponding detailed design encodings at a lower abstraction version of the electronic design based at least in part on maintaining the first resolution and a second resolution for the at least the portion of the electronic design at the at least one successively lower level of abstraction at approximately a same level; and
verifying one or more properties at some or all of the different abstraction levels of the electronic design, wherein
a property verified at first abstraction level of the design will remain true at a second abstraction level of the design.

31. The computer program product of claim 30 in which the higher abstraction version focuses on a more global property and the lower abstraction version focuses on a more local property of the electronic design.

32. The computer program product of claim 30 in which a given abstraction level of the electronic design may have different portions of the electronic design at different abstraction levels, with a first portion of the electronic design is at a higher abstraction level and a second portion of the electronic design simultaneously at a lower abstraction level.

33. The computer program product of claim 30 further comprising identification of properties for the electronic design and categorization of the properties into different groups.

34. The computer program product of claim 33 further comprising defining a refinement hierarchy.

35. The computer program product of claim 34 implemented with a control flow graph corresponding to the electronic design, wherein the control flow graph is encoded as a state machine.

36. The computer program product of claim 35 in which one or more actions are represented by one or more tokens that correspond to non-deterministic events.

37. The computer program product of claim 36 in which refinement is performed by replacing the one or more tokens with additional state machines that encode more detailed behavior.

38. The computer program product of claim 30 in which the one or more stubs comprise behavior that is non-deterministic.

39. The computer program product of claim 30 in which refinement of the electronic design does not require completely rewriting the electronic design between different abstraction levels.

40. The computer program product of claim 30 in which the electronic design comprises both hardware and software design components.

41. The computer program product of claim 30 in which the electronic design comprises design IP comprising off-the-shelf components or blocks.

42. The computer implemented method of claim 1, wherein behavior of at least one of the one or more stubs in the at least the portion of the electronic design at the higher abstraction version remains non-deterministic after performance of the act of refining the at least the portion of the electronic design.

* * * * *